United States Patent
Mandell et al.

Patent Number: 5,955,917
Date of Patent: Sep. 21, 1999

[54] NONLINEAR AMPLIFIER CALIBRATION SYSTEM AND METHODS

[75] Inventors: Michael I. Mandell, Los Angeles; Chak M. Chie, Culver City; Wei-Chun Wang, Temple City; Arnold L. Berman, Los Angeles, all of Calif.

[73] Assignee: Hughes Electronics Corporation, El Segundo, Calif.

[21] Appl. No.: 08/921,749

[22] Filed: Aug. 27, 1997

[51] Int. Cl.[6] .............................. G01R 19/00; H03F 3/66; H03G 3/20
[52] U.S. Cl. .................................. 330/2; 330/52; 330/129
[58] Field of Search ........................... 330/2, 129, 124 R, 330/52, 107, 149

[56] References Cited

U.S. PATENT DOCUMENTS 5,561,395  10/1996  Melton et al. ............................... 330/2

Primary Examiner—Robert Pascal
Assistant Examiner—Patricia Nguyen
Attorney, Agent, or Firm—Georgann S. Grunebach; M. W. Sales

[57] ABSTRACT

Apparatus and methods that compensate for the effects of gain and phase variations of a high power amplifier in the presence of multicarrier traffic. The calibration system and method impose negligible degradation to the multicarrier traffic processed by the high power amplifier. A calibration signal generator is used to generate a plurality of nondisrupting calibration signals, such as pseudorandom numbers, which are also summed and combined with the multicarrier traffic signals. The plurality of nondisrupting calibration signals are also combined to produce a combined nondisrupting calibration signal. Each of the nondisrupting calibration signals is selectively output and is combined with sampled versions of the amplified multicarrier traffic signals produced by the high power amplifier to despread them. The despread multicarrier traffic signals are then processed in a processor to generate signals indicative of total signal power, intermodulation power, and phase shift of the despread multicarrier traffic signals to determine a current operating point of the high power amplifier on its gain transfer curve. Gain and phase control signals are generated by a processor that are coupled to the gain control and phase control circuits to set the amplifier at its most desirable operating point.

11 Claims, 3 Drawing Sheets

NONLINEAR AMPLIFIER CALIBRATION SYSTEM AND METHODS

BACKGROUND

The present invention relates generally to communication systems, and more particularly, to nonlinear amplifier calibration system and methods that calibrates out effects of gain and phase variations of a high power amplifier of a communication system in the presence of multicarrier traffic, while negligibly degrading the traffic.

Gain and phase variation of a high power amplifier are grossly a function of temperature and are typically calibrated out using temperature compensation circuits. It has been believed that in a system that has a large number of high power amplifiers and a processor, such as a communications system, for example, temperature compensation circuits would be more costly than a calibration system described herein.

Conventional systems using only signal power measurements require either extremely precise measurements or require adjusting the gain over a wide range of values which disturbs the traffic during calibration. In addition, prior calibration systems do not allow for gain and phase variations not a function of temperature variations (such as aging effects) to be calibrated out.

Accordingly, it is an objective of the present invention to provide for an amplifier calibration system and methods that compensates for (calibrates out) effects of gain and phase variations of high power amplifiers of a communication system in the presence of multicarrier traffic. It is a further objective of the present invention to provide for a calibration system and methods that negligibly degrades multicarrier traffic processed by a communication system while compensating for the effects of gain and phase variations of high power amplifiers of the communication system.

SUMMARY OF THE INVENTION

To meet the above and other objectives, the present invention provides for a calibration system and methods that compensates for the effects of gain and phase variations of a high power amplifier in the presence of multicarrier traffic. The present calibration system and methods imposes negligible degradation to the multicarrier traffic processed by the high power amplifier.

The calibration system is used in a system that processes multicarrier traffic signals processed by a gain control circuit and a phase control circuit and applied to a high power amplifier. The calibration system comprises a sampling device coupled to the high power amplifier for sampling amplified multicarrier traffic signals produced thereby. A calibration signal generator is provided for generating a plurality of nondisrupting calibration signals, such as pseudorandom sequences, for example. The calibration signal generator sums the plurality of nondisrupting calibration signals, and combines them with the multicarrier traffic signals. The calibration signal generator also combines the plurality of nondisrupting calibration signals to produce a combined nondisrupting calibration signal.

A selection circuit is coupled to the calibration signal generator for selectively outputting one of the nondisrupting calibration signals. A combiner such as a multiplier, is coupled to the sampling device and to the selection circuit for combining the multicarrier traffic signals and a selected one of the nondisrupting calibration signals to despread the multicarrier traffic signals. A processor is coupled to the combiner for processing the despread multicarrier traffic signals to selectively generate signals indicative of total signal power, intermodulation power, and phase shift of the despread multicarrier traffic signals to determine a current operating point of the high power amplifier on its gain transfer curve. The processor also generates gain and phase control signals that are coupled to the gain control and phase control circuits to set the amplifier at its most desirable operating point.

The present method is used to calibrate a high power amplifier that processes multicarrier traffic signals and whose operating point is controlled by a gain control circuit and a phase control circuit. The method generates a plurality of nondisrupting calibration signals, and sums the plurality of nondisrupting calibration signals. The summed plurality of nondisrupting calibration signals are combined with the multicarrier traffic signals. The plurality of nondisrupting calibration signals are combined to produce a combined nondisrupting calibration signal.

Each of the nondisrupting calibration signals is selectively output. The amplified multicarrier traffic signals produced by the high power amplifier are sampled. The multicarrier traffic signals and the selected nondisrupting calibration signal are combined to despread the multicarrier traffic signals. The despread multicarrier traffic signals are then processed to generate signals indicative of total signal power, intermodulation power, and phase shift of the despread multicarrier traffic signals to determine a current operating point of the high power amplifier on its gain transfer curve. Gain and phase control signals are generated and coupled to the gain control and phase control circuits to set the amplifier at its most desirable operating point.

The present invention advantageously uses a processor in a system containing a high power amplifier to produce calibration signals and make gain adjusts based on power measurements taken after the high power amplifier. This approach is believed to be a cost effective way to calibrate out errors due to gain and phase variations. The present invention provides for a signal set and algorithm that has the following properties. The algorithm is unconditionally stable in the presence of imperfect measurements. Calibration may be performed continuously in the presence of multicarrier traffic while imposing negligible degradation to that traffic.

Furthermore, the calibration system allows for gain and phase variations not due to temperature variation (such as aging effects) to be calibrated out. The key aspect of the calibration system is that the calibration signals are designed to allow measurements of both signal power and interference power at the output of the high power amplifier. This allows for continuous calibration without disturbing the traffic by adjusting the gain over a wide range of values. Conventional systems using only signal power measurements require either extremely precise measurements or require adjusting the gain over a wide range of values which disturbs the traffic during calibration.

The present invention may be used with any system using nonlinear amplifiers where the effects of gain and phase variation are critical to system performance. The present calibration system is specifically designed for mobile and cellular communications system.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
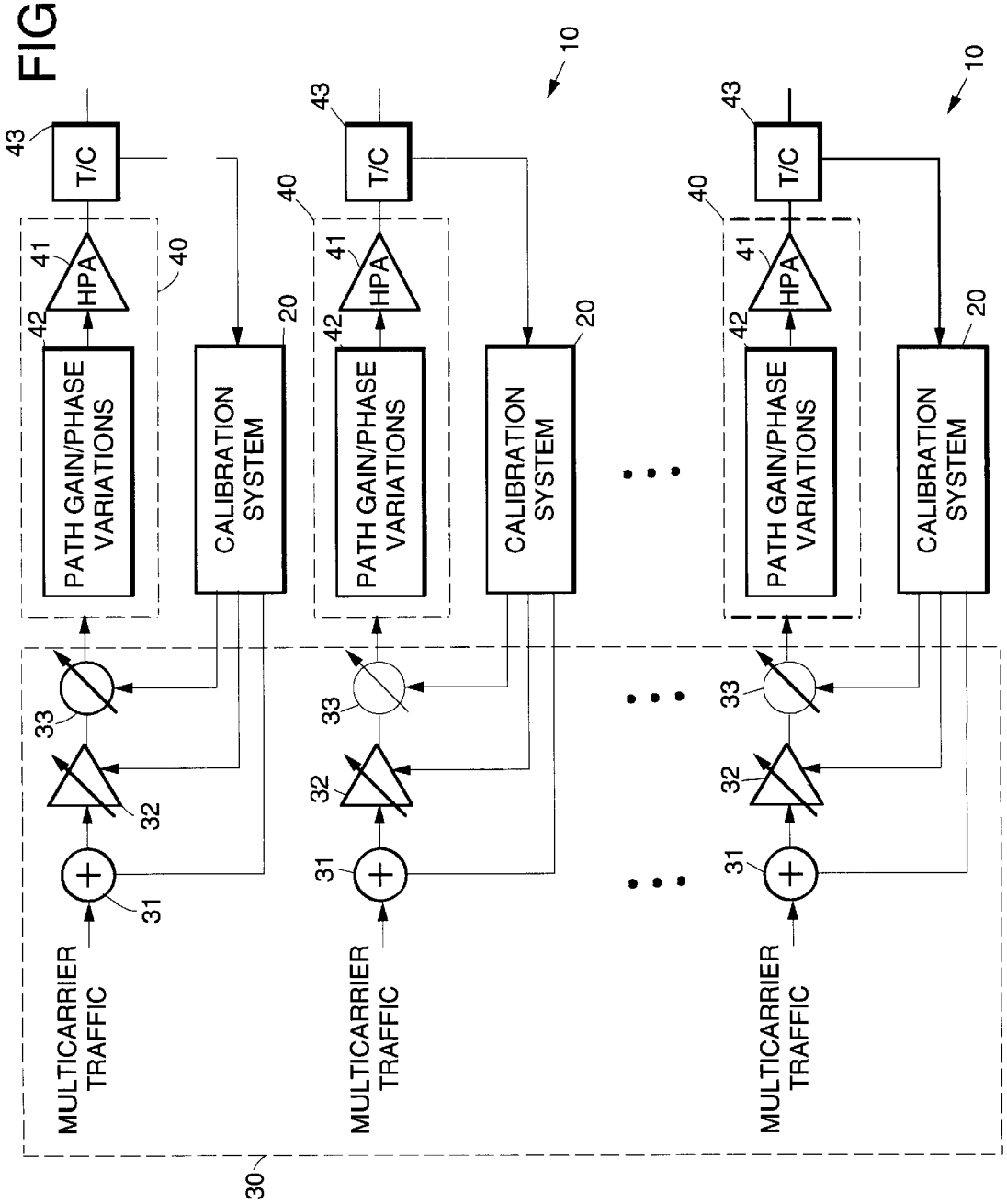
FIG. 1 illustrates a block diagram of system employing nonlinear amplifier calibration systems in accordance with the principles of the present invention.

Referring to the drawing figures, FIG. 1 illustrates a block diagram of a system 10, such as a communication system 10, for example, employing a plurality of nonlinear amplifier calibration systems 20 in accordance with the principles of the present invention. The system 10 may comprise a processor 30 that is employed in conjunction with each of the calibration systems 20. The processor 30 comprises a plurality of sets of first summing devices 31, gain control circuits 32 and phase control circuits 33 that each process multicarrier traffic signals input to the respective first summing devices 31. The multicarrier traffic signals processed by the respective sets of first summing devices 31, gain control circuits 32 and phase control circuits 33 are respectively applied to a plurality of high power amplifier (HPA) structures 40. There is one calibration system 20 for each high power amplifier structure 40.

Each high power amplifier structure 40 includes a high power amplifier 41 and components or other structure that produce gain and phase variations 42. Outputs of each of the high power amplifier structures 40 are coupled to a respective plurality of test couplers (TC) 43. The output from each high power amplifier structure 40 is coupled by way of the respective coupler 43 to each of the calibration systems 20 which feeds back signals to the respective first summing device 31, gain control circuit and phase control circuit to compensate for the effects of gain and phase variations of the respective high power amplifier 41 in the presence of the multicarrier traffic signals.

Figure 2:
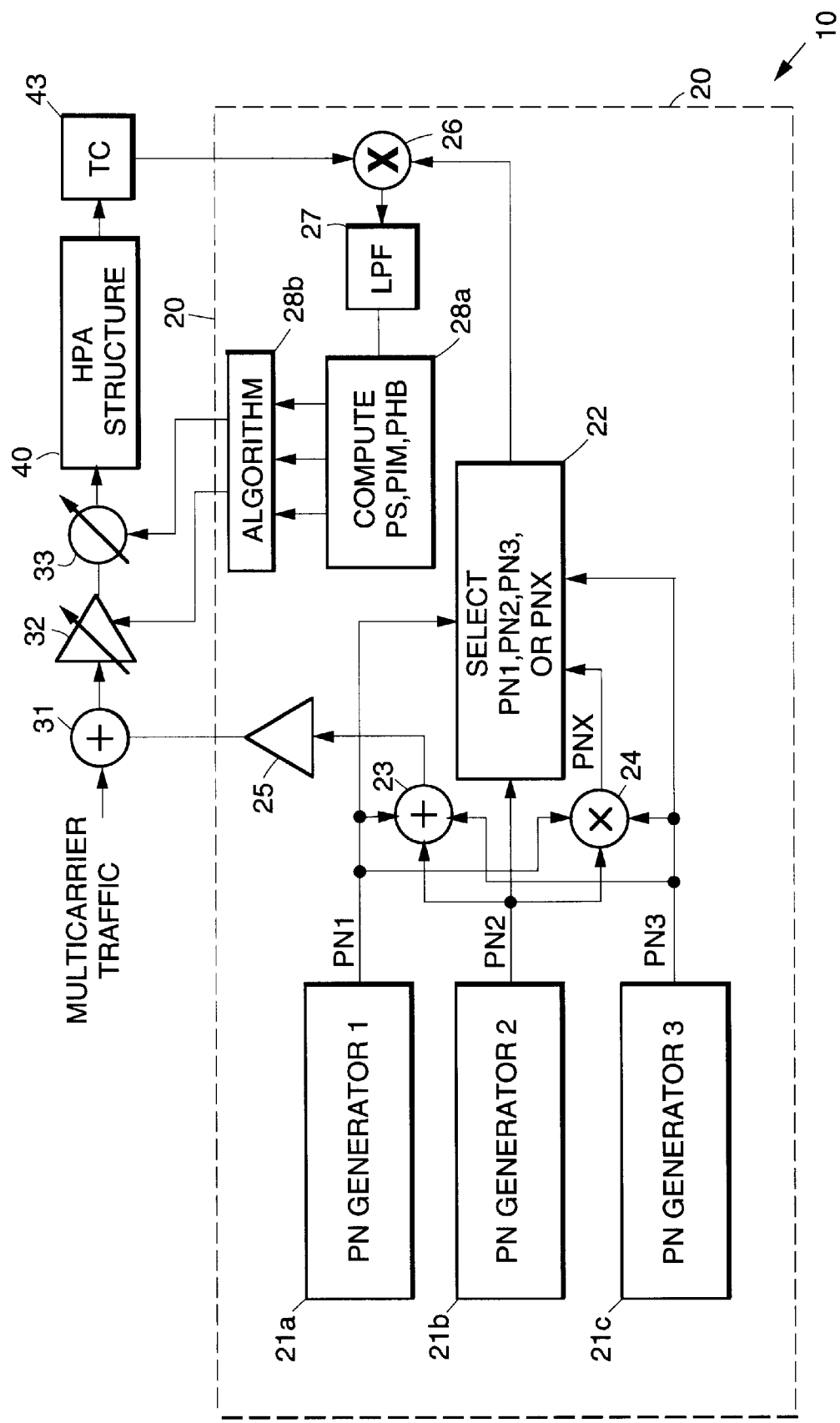
FIG. 2 illustrates a portion of the system of FIG. 1, specifically showing details of the calibration system of the present invention.

Referring now to FIG. 2, it shows a portion of the system 10 of FIG. 1, specifically illustrating details of each calibration system 20. In particular, one channel of the system 10 is shown illustrating the first summing device 31, gain control circuit 32, phase control circuit 33, the high power amplifier structure 40, and the coupler 43. The first summing device 31 and the coupler 43 form part of the calibration system 20 in that they are used to sample the multicarrier traffic signals and inject nondisrupting calibration signals into the multicarrier traffic signals for processing.

The calibration system 20 comprises calibration signal generation means 21 that includes three pseudorandom sequence generators 21a, 21b, 21c that output three independent and distinct pseudorandom sequences (PN1, PN2, PN3). The pseudorandom sequences (PN1, PN2, PN3) output by the sequence generators 21a, 21b, 21c are input to a selection circuit 22. The pseudorandom sequences (PN1, PN2, PN3) output by the sequence generators 21a, 21b, 21c are also input to a second summing device 23 and to a first multiplier 24. The output of the second summing device 23 is coupled by way of an amplifier 25 to the first summing device 31 in the processor 30. The output of the multiplier 24 is a fourth or combined (multiplied) pseudorandom sequence (PNX) that is input to the selection circuit 22. The selection circuit 22 is used to selectively output one of the four pseudorandom sequences (PN1, PN2, PN3, PNX) input thereto.

The multicarrier traffic signals output provided by the test coupler 43 is coupled to a first input of a second multiplier 26. The selected pseudorandom sequence (PN1, PN2, PN3, PNX) output from the selection circuit 22 is coupled to a second input of the second multiplier 26. The second multiplier 26 is used to combine the multicarrier traffic signals with the selected pseudorandom sequence to despread the multicarrier traffic signals. The output of the second multiplier 26 is coupled by way of a low pass filter 27 to processing means 28 that computes 28a total signal power (PS), intermodulation power (PIM), and phase shift (PHS) of the despread multicarrier traffic signals. The computed signal outputs (PS, PIM, PHS) are processed by a processing algorithm 28b to determine the current operating point of the high power amplifier 41 on its gain transfer curve, and then generates gain and phase control signals that are applied to the gain control and phase control circuits 32, 33 to set the amplifier 41 at its most desirable operating point.

While the calibration system 20 disclosed with reference to FIG. 2 has been shown as a separate structure, it is to be understood that some of all of the calibration system 20 may be embedded in the processor 30. The primary concept of the present invention is that the calibration system 20 adds a calibration signal onto the traffic, looks at what is received at the test coupler (TC), and adjusts the amplitude and phase at the output of the processor 30. The key aspect of the calibration system 20 is that it uses calibration signals that allow measurement of the signal and interference power without disrupting the operating point of the high power amplifier 42.

Referring again to FIG. 2, in operation, the three independent pseudorandom (PN) sequence generators 21a, 21b, 21c create three pseudorandom sequences PN1, PN2, PN3. It is to be understood that, alternatively, three shifted versions of the same pseudorandom sequence would also provide for an acceptable implementation. The pseudorandom sequences are added together, suitably scaled by the amplifier 25 to provide an appropriate signal level, and then added to the multicarrier traffic signal in the first summing device 31. The product of the three pseudorandom sequences (PN1, PN2, PN3) is also computed in the multiplier 24 resulting in the pseudorandom sequence PNX.

At the output of the test coupler 43, the signal is despread in the second multiplier 26 using one of the pseudorandom sequences PN1, PN2, PN3, or PNX and then low-pass filtered in the filter 27. When PN1, PN2, or PN3 is selected, the output of the low pass filter 27 may be used to compute the total signal power (PS) at the output of the high power amplifier structure 40, and the phase shift (PHS) between the output of the processor 30 and the output of the high power amplifier structure 40. When PNX is selected, the output of the low pass filter 27 may be used to compute the total intermodulation power (PIM) at the output of the high power amplifier structure 40.

The signal power (PS), the phase shift (PHS) and the total intermodulation power (PIM) are computed as follows using algorithm 28b. Select one of the sequences PN1, PN2, or PN3 in the selection circuit 22. Adjust the phase of that sequence so that the output power of the low pass filter 27 is maximized. At this point, the phase of the sequence is PHS, and the output of the low pass filter 27 is PS. Next, select sequence PNX in the selection circuit 22. The output of the low pass filter 27 is PIM.

The algorithm 28b used knowledge PS, PHS and PIM to determine the gain of the variable gain element 32 and the phase shift of the variable phase shift element 33. An example of such an algorithm would be to adjust the variable phase shift element 33 to offset the phase shift PHS, and to adjust the variable gain element 32 to bring PS as close as possible to the desired operating point without allowing the ratio PS/PIM to exceed some threshold.

In contrast to the present invention, conventional calibration systems using only measurements of total signal power (PS) and the phase shift (PHS) require either nearly infinitely precise measurements or disruption of the signal level to determine the location of the current operating point on the gain transfer curve.

Figure 3:
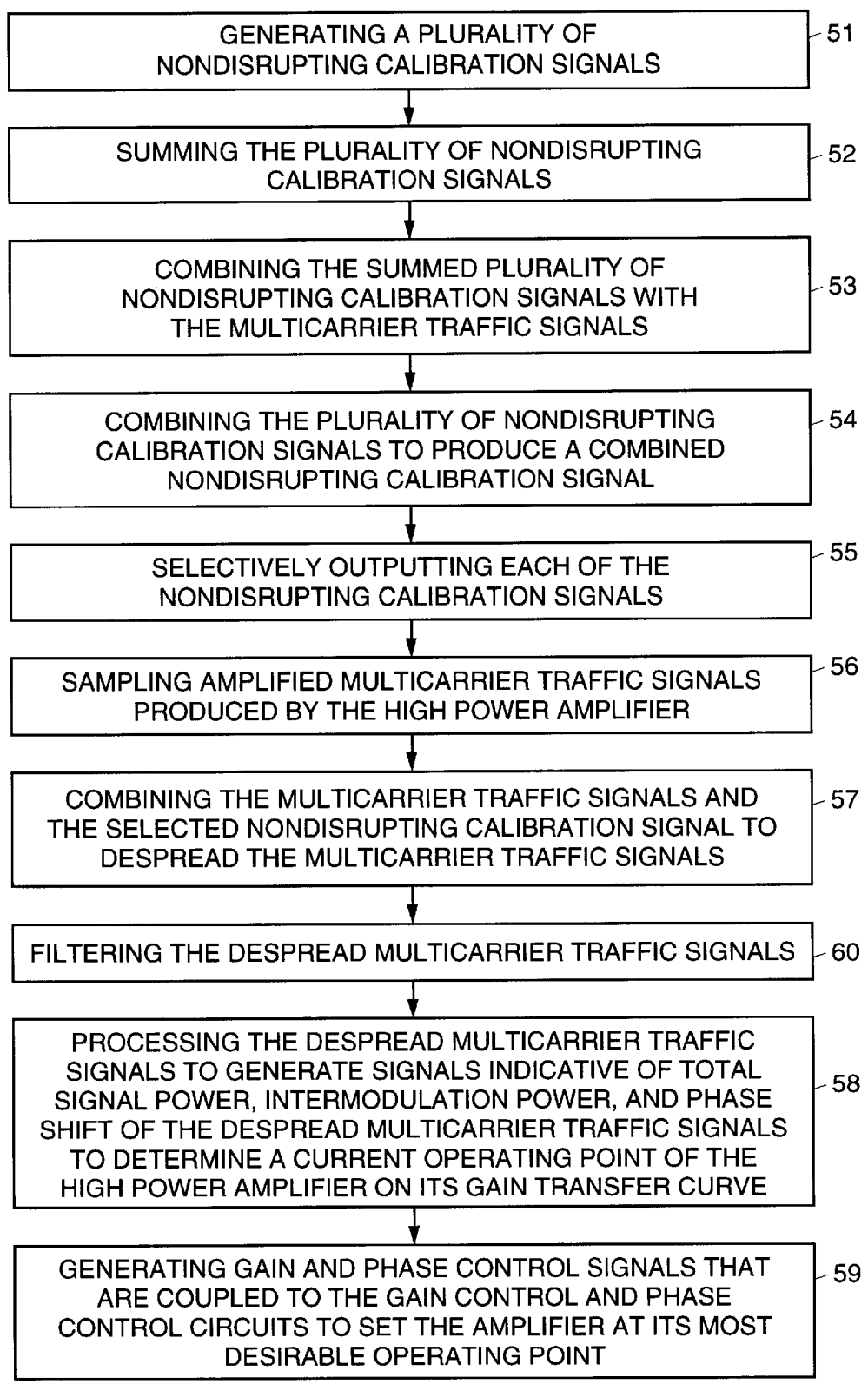
FIG. 3 is a flow diagram illustrating steps in one method in accordance with the principles of the present invention.

For the purposes of completeness, FIG. 3 is a flow diagram illustrating steps in one method 50 in accordance with the principles of the present invention. The method 50 is used to calibrate a high power amplifier 41 that processes multicarrier traffic signals and whose operating point is controlled by a gain control circuit 32 and a phase control circuit 33.

The method 50 comprises the steps of generating 51 a plurality of nondisrupting calibration signals, and summing 52 the plurality of nondisrupting calibration signals. The summed plurality of nondisrupting calibration signals are combined 53 with the multicarrier traffic signals. The plurality of nondisrupting calibration signals are combined 54 to produce a combined nondisrupting calibration signal. Each of the nondisrupting calibration signals is selectively output 55. The amplified multicarrier traffic signals produced by the high power amplifier 41 are sampled 56. The multicarrier traffic signals and the selected nondisrupting calibration signal are combined 57 to despread the multicarrier traffic signals.

The despread multicarrier traffic signals are then processed 58 to generate signals indicative of total signal power, intermodulation power, and phase shift of the despread multicarrier traffic signals to determine a current operating point of the high power amplifier 41 on its gain transfer curve. Gain and phase control signals are generated 59 and coupled to the gain control and phase control circuits 32, 33 to set the amplifier 41 at its most desirable operating point. Prior to processing 58 the despread multicarrier traffic signals, the despread multicarrier traffic signals may be filtered 60.

Thus, amplifier calibration apparatus and methods have been disclosed that compensates for the effects of gain and phase variations of a high power amplifier of the communication system in the presence of multicarrier traffic, while imposing negligible degradation to the traffic. It is to be understood that the described embodiments are merely illustrative of some of the many specific embodiments which represent applications of the principles of the present invention. Clearly, numerous and other arrangements can be readily devised by those skilled in the art without departing from the scope of the invention.

What is claimed is:

1. Amplifier calibration apparatus for use in a system that processes multicarrier traffic signals processed by a gain control circuit and a phase control circuit and applied to a high power amplifier, said calibration apparatus comprising:

sampling means coupled to the high power amplifier for sampling amplified multicarrier traffic signals produced by the high power amplifier;

calibration signal generation means for generating a plurality of nondisrupting calibration signals, for summing the plurality of nondisrupting calibration signals, for combining the summed plurality of nondisrupting calibration signals with the multicarrier traffic signals, and for combining the plurality of nondisrupting calibration signals to produce a combined nondisrupting calibration signal;

a selection circuit coupled to the calibration signal generation means for selectively outputting one of the nondisrupting calibration signals;

combining means coupled to the sampling means and to the selection circuit for combining the multicarrier traffic signals and a selected one of the nondisrupting calibration signals to despread the multicarrier traffic signals; and processing means coupled to the combining means for processing the despread multicarrier traffic signals to selectively generate signals indicative of total signal power, intermodulation power, and phase shift of the despread multicarrier traffic signals to determine a current operating point of the high power amplifier on its gain transfer curve, and for generating gain and phase control signals that are coupled to the gain control and phase control circuits to set the amplifier at its most desirable operating point.

2. The apparatus of claim 1 wherein the calibration signal generation means comprises:

a plurality of pseudorandom sequence generators for generating a plurality of independent and distinct pseudorandom sequences.

3. The apparatus of claim 2 wherein the calibration signal generation means further comprises:

a second summing device coupled to the pseudorandom sequence generators for combining the plurality of pseudorandom sequences to produce a summed pseudorandom sequence;

a first summing device coupled to the second summing device and the gain control circuit for combining the summed pseudorandom sequences with the multicarrier traffic signals;

a first multiplier coupled to the pseudorandom sequence generators for combining the three pseudorandom sequences to produce a combined pseudorandom sequence.

4. The apparatus of claim 3 further comprising scaling means coupled between the second summing device and the first summing device for scaling the summed pseudorandom sequence applied to the first summing device.

5. The apparatus of claim 2 wherein the scaling means comprises an amplifier.

6. The apparatus of claim 1 further comprising a low pass filter coupled between the combining means and the processing means for filtering the despread multicarrier traffic signals.

7. Amplifier calibration apparatus for use in a system that processes multicarrier traffic signals processed by a first summing device, a gain control circuit and a phase control circuit and applied to a high power amplifier, said calibration apparatus comprising:

a test coupler connected to an output of the high power amplifier for coupling amplified multicarrier traffic signals produced by the high power amplifier;

three pseudorandom sequence generators for generating three independent and distinct pseudorandom sequences (PN1, PN2, PN3);

a second summing device coupled to the sequence generators for summing the three pseudorandom sequences (PN1, PN2, PN3);

an amplifier coupled between the second summing device and the first summing device for scaling the summed pseudorandom sequences applied to the first summing device;

a first multiplier coupled to the sequence generators for combining the three pseudorandom sequences to produce a fourth pseudorandom sequence (PNX);

a selection circuit coupled to the three pseudorandom sequence generators and to the first multiplier for outputting a selected one of the four pseudorandom sequences (PN1, PN2, PN3, PNX);

a second multiplier coupled to the test coupler and to the selection circuit for combining the multicarrier traffic signals and a selected one of the four pseudorandom sequences to despread the multicarrier traffic signals; and processing means coupled to the low pass filter for processing the despread multicarrier traffic signals to selectively generate signals indicative of total signal power, intermodulation power, and phase shift of the despread multicarrier traffic signals to determine a current operating point of the high power amplifier on its gain transfer curve, and for generating gain and phase control signals that are coupled to the gain control and phase control circuits to set the amplifier at its most desirable operating point.

8. The apparatus of claim 7 further comprising a low pass filter coupled between the second multiplier and the processing means for filtering the despread multicarrier traffic signals.

9. A method of calibrating a high power amplifier that processes multicarrier traffic signals and whose operating point is controlled by a gain control circuit and a phase control circuit, said method comprising the steps of:

generating a plurality of nondisrupting calibration signals;

summing the plurality of nondisrupting calibration signals;

combining the summed plurality of nondisrupting calibration signals with the multicarrier traffic signals;

combining the plurality of nondisrupting calibration signals to produce a combined nondisrupting calibration signal;

selectively outputting each of the nondisrupting calibration signals;

sampling amplified multicarrier traffic signals produced by the high power amplifier;

combining the multicarrier traffic signals and the selected nondisrupting calibration signal to despread the multicarrier traffic signals;

processing the despread multicarrier traffic signals to generate signals indicative of total signal power, intermodulation power, and phase shift of the despread multicarrier traffic signals to determine a current operating point of the high power amplifier on its gain transfer curve; and generating gain and phase control signals that are coupled to the gain control and phase control circuits 32, 33 to set the amplifier at its most desirable operating point.

10. The method of claim 9 wherein the step of generating a plurality of nondisrupting calibration signals comprises the step of generating a plurality of independent and distinct pseudorandom sequences.

11. The method of claim 9 further comprising the step of filtering the despread multicarrier traffic signals prior to processing the despread multicarrier traffic signals.

* * * * *